United States Patent
Kim et al.

(10) Patent No.: US 9,159,776 B2
(45) Date of Patent: Oct. 13, 2015

(54) ORGANIC LIGHT EMITTING DIODE DISPLAY

(71) Applicant: Samsung Display Co., Ltd., Yongin-si, Gyeonggi-do (KR)

(72) Inventors: Jae-Kyoung Kim, Yongin (KR); Man-Seob Choi, Yongin (KR); Won-Gyun Kim, Yongin (KR); Hae-Yun Choi, Yongin (KR); Jong-In Baek, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/215,305

(22) Filed: Mar. 17, 2014

(65) Prior Publication Data
US 2015/0008397 A1    Jan. 8, 2015

(30) Foreign Application Priority Data
Jul. 5, 2013    (KR) ................. 10-2013-0079286

(51) Int. Cl.
*H01L 35/24*    (2006.01)
*H01L 27/32*    (2006.01)

(52) U.S. Cl.
CPC ........ *H01L 27/3262* (2013.01); *H01L 27/3211* (2013.01); *H01L 27/3216* (2013.01); *H01L 2251/558* (2013.01)

(58) Field of Classification Search
CPC .................. H01L 2251/50; H01L 2251/558; H01L 27/3211; H01L 27/3216
USPC ................... 257/40, 79, 88, 89, 98, E51.018, 257/E51.019, E51.021, E51.022
See application file for complete search history.

(56) References Cited

U.S. PATENT DOCUMENTS

2007/0057251 A1*  3/2007  Wang et al. .............. 257/40

FOREIGN PATENT DOCUMENTS

| KR | 10-2009-0038637 | 4/2009 |
| KR | 10-2009-0126955 | 12/2009 |
| KR | 10-2009-0132356 | 12/2009 |
| KR | 10-2010-0041314 | 4/2010 |

* cited by examiner

*Primary Examiner* — Matthew E Warren
(74) *Attorney, Agent, or Firm* — Knobbe Martens Olson & Bear LLP (57) ABSTRACT

An organic light emitting diode (OLED) display includes: a substrate; and a plurality of pixels positioned on the substrate. Each pixel includes a thin film transistor positioned on the substrate, an interlayer insulating layer and a light path control layer positioned on the thin film transistor, a first electrode positioned on the light path control layer and connected to the thin film transistor, an organic emission layer positioned on the first electrode, and a second electrode positioned on the organic emission layer, and the light path control layer includes a first control layer, a second control layer having a larger refractive index than the first control layer, and a middle layer having the same refractive index as the first control layer.

12 Claims, 13 Drawing Sheets

ORGANIC LIGHT EMITTING DIODE DISPLAY

RELATED APPLICATIONS

This application claims priority to, and the benefit of, Korean Patent Application No. 10-2013-0079286 filed in the Korean Intellectual Property Office on Jul. 5, 2013, the entire contents of which are incorporated herein by reference.

BACKGROUND

1. Field

The described technology relates generally to an organic light emitting diode (OLED) display.

2. Description of the Related Technology

An organic light emitting diode (OLED) display is a self emissive display device that displays images with organic light emitting diodes. The organic light emitting diode display differs from a liquid crystal display (LCD) in that it does not require a separate light source, so it generally has relatively small thickness and weight. Further, the organic light emitting diode display has high-quality characteristics such as low power consumption, high luminance, and high reaction speed, such that it is gaining more and more attention as a next-generation display device for portable electronic devices.

The organic light emitting diode display can be classified into a passive matrix type and an active matrix type according to a driving method. The active matrix-type organic light emitting diode display includes an organic light emitting diode, a thin film transistor (TFT), and a capacitor for each pixel to independently control the pixel.

In the organic light emitting diode (OLED) display, organic emission layers emitting light of different colors are formed to emit red, green, and blue or the red, green, and blue lights are realized by using color filters after forming an organic emission layer emitting white light.

As described above, to realize the red, green, and blue lights by using the color filters requires forming the color filters by a photolithography process according to each color such that a manufacturing process may be complicated.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

An embodiment provides an organic light emitting diode (OLED) display realizing red, green, and blue pixels without color filters.

An organic light emitting diode (OLED) display according to an embodiment includes: a substrate; and a plurality of pixels positioned on the substrate, wherein each of the plurality of pixels includes a thin film transistor positioned on the substrate, an interlayer insulating layer and a light path control layer positioned on the thin film transistor, a first electrode positioned on the light path control layer and connected to the thin film transistor, an organic emission layer positioned on the first electrode, and a second electrode positioned on the organic emission layer, where the light path control layer includes a first control layer, a second control layer having a larger refractive index than the first control layer, and a middle layer having the same refractive index as the first control layer.

The first control layer and the second control layer may be positioned as a pair at both sides of the middle layer.

A plurality of pairs of the first control layer and the second control layer may be positioned around the middle layer, and the first control layer and the second control layer may be alternatively disposed.

The first control layer and the second control layer may be symmetrical with respect to the middle layer.

The first control layer may include at least one of $SiO_2$ or $MgF_3$.

The second control layer may include at least one of $TiO_2$, $ZnS$, $CeO_2$, $Al_2O_3$, $SiN_x$, or $ZrO_2$.

The organic emission layer may emit white light.

The organic emission layer may include a red emission layer, a green emission layer, and a blue emission layer.

The pixel may include a red pixel, a green pixel, and a blue pixel, and thicknesses of the middle layer respectively positioned at the red, the green, and the blue pixels may be different from one another.

The thickness of the middle layer of the blue pixel is larger than the thickness of the middle layer of the red pixel and wherein the thickness of the middle layer of the red pixel is larger than the thickness of the middle layer of the green pixel.

The thicknesses of each of the respective middle layers of the green pixel, the red pixel, and the blue pixel may be in a range from about 3% to 5% of the thickness of the light path control layer.

The thickness of the light path control layer may be less than about 1 μm.

As described, by forming the light path control layer, the red pixel, the green pixel, and the blue pixel may be easily realized without the color filters.

DETAILED DESCRIPTION OF CERTAIN INVENTIVE EMBODIMENTS

One or more embodiments will be described more fully hereinafter with reference to the accompanying drawings, in which certain embodiments are shown. As those skilled in the art would realize, the described embodiments may be modified in various ways, without departing from the spirit or scope of the present invention.

In the drawings, the thickness of layers, films, panels, regions, etc., may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

An organic light emitting diode (OLED) display according to an embodiment will be described with reference to accompanying drawings.

Figure 1:
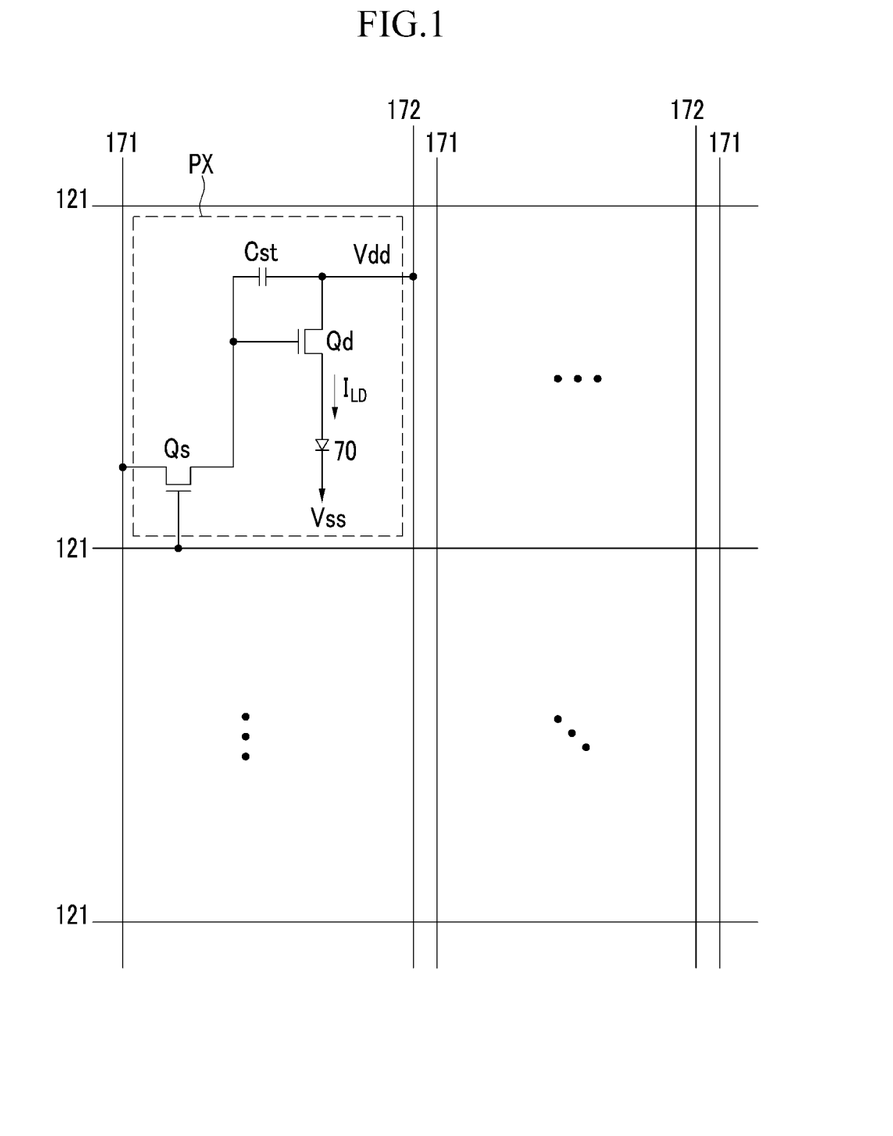
FIG. 1 is a circuit diagram of a pixel circuit included in an organic light emitting diode (OLED) display according to an embodiment.

FIG. 1 is a circuit diagram of a pixel circuit included in an organic light emitting diode (OLED) display according to an embodiment.

As shown in FIG. 1, an organic light emitting diode display according to an embodiment includes a plurality of signal lines 121, 171, and 172, and a plurality of pixels (PX) connected thereto and arranged in an approximate matrix form.

The signal lines include a plurality of gate lines 121 transferring a gate signal (or a scan signal), a plurality of data lines 171 transferring a data signal, and a plurality of driving voltage lines 172 transferring a driving voltage (Vdd). The gate lines 121 extend in an approximate row direction and are substantially parallel to each other, and vertical direction portions of the data line 171 and the driving voltage line 172 extend in an approximate column direction and are substantially parallel to each other.

Each pixel PX includes a switching thin film transistor (Qs), a driving thin film transistor (Qd), a storage capacitor (Cst), and an organic light emitting diode (OLED, or LD) 70.

The switching thin film transistor (Qs) has a control terminal, an input terminal, and an output terminal. The control terminal is connected to the gate line 121, the input terminal is connected to the data line 171, and the output terminal is connected to the driving thin film transistor (Qd). The switching thin film transistor (Qs) responds to the scan signal applied to the gate line 121 to transfer the data signal applied to the data line 171 to the driving thin film transistor (Qd).

Further, the driving thin film transistor (Qd) also has a control terminal, an input terminal, and an output terminal. The control terminal is connected to the switching thin film transistor (Qs), the input terminal is connected to the driving voltage line 172, and the output terminal is connected to the organic light emitting diode 70. The driving thin film transistor (Qd) allows an output current (ILD), having a magnitude that varies according to a voltage applied between the control terminal and the output terminal, to flow.

The storage capacitor (Cst) is connected between the control terminal and the input terminal of the driving thin film transistor (Qd). This storage capacitor (Cst) charges the data signal applied to the control terminal of the driving thin film transistor (Qd) and maintains the data signal after the switching thin film transistor (Qs) is turned off.

The organic light emitting diode (LD) 70 has an anode connected to the output terminal of the driving thin film transistor (Qd), and a cathode connected to a common voltage (Vss). The organic light emitting diode (LD) displays an image by emitting light while changing the intensity thereof according to the output current (ILD) of the driving thin film transistor (Qd).

Further, the connection relationship of the thin film transistors (Qs, Qd), the capacitor (Cst), and the organic light emitting diode 70 may vary.

Next, referring to FIG. 2 and FIG. 3, the organic light emitting diode (OLED) display according to an embodiment will be described in detail.

Figure 2:
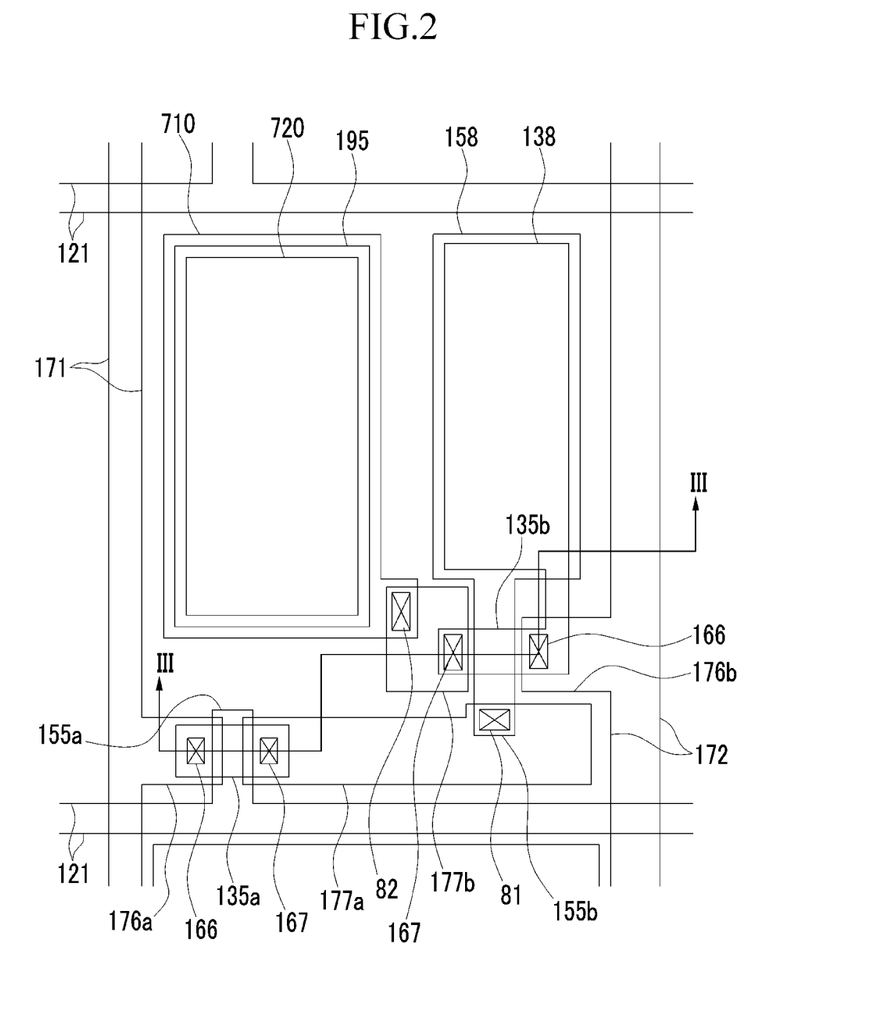
FIG. 2 is a layout view of one pixel of the organic light emitting diode (OLED) display of FIG. 1.
Figure 3:
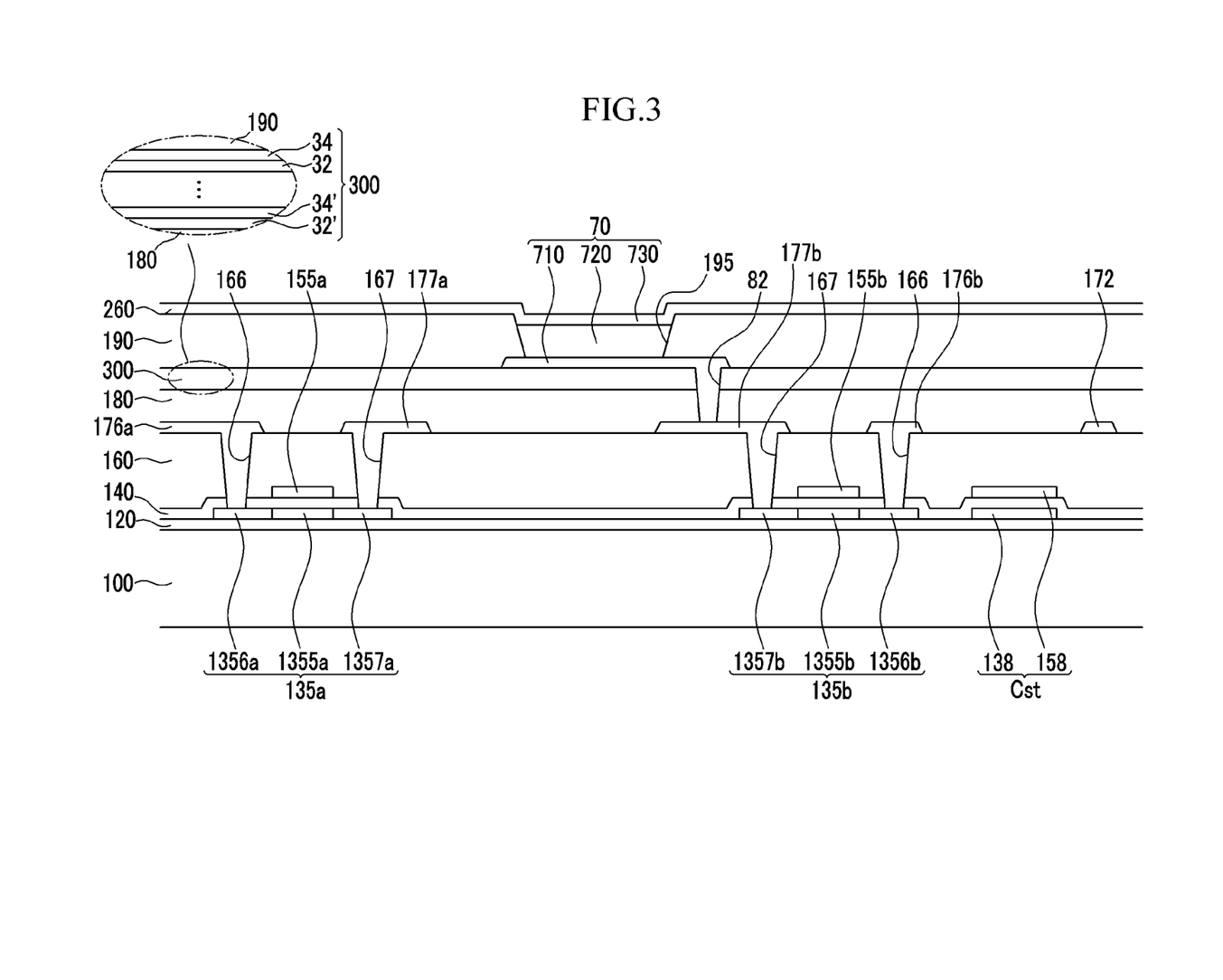
FIG. 3 is a cross-sectional view taken along the line III-III of FIG. 2.

FIG. 2 is a layout view of one pixel of the organic light emitting diode (OLED) display of FIG. 1, and FIG. 3 is a cross-sectional view taken along the line of FIG. 2.

As shown in FIG. 2 and FIG. 3, a buffer layer 120 is formed on a substrate 100.

The substrate 100 may be an insulating substrate made of glass, quartz, ceramic, or a polymer material, and the substrate 100 may be a metallic substrate made of stainless steel. The polymer material may be an organic material such as polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), or cellulose acetate propionate (CAP), which are insulating organic materials.

The buffer layer 120 may have a single-layered structure of silicon nitride ($SiN_x$), or a double-layered structure of silicon nitride ($SiN_x$) and silicon oxide ($SiO_2$). The buffer layer has a role of preventing unneeded components like impure elements or moisture from intruding into a target, while simultaneously flattening the surface thereof.

A first semiconductor 135a and a second semiconductor 135b both made of polysilicon and a first capacitor electrode 138 are formed on the buffer layer 120.

The first semiconductor 135a and the second semiconductor 135b are divided into respective channel regions 1355a and 1355b and source regions 1356a and 1356b and drain regions 1357a and 1357b, respectively, formed on both sides of the channel regions 1355a and 1355b. The channel regions 1355a and 1355b of the first semiconductor 135a and the second semiconductor 135b are polysilicon into which impurities have not been doped, that is, intrinsic semiconductors. The source regions 1356a and 1356b and the drain regions 1357a and 1357b of the first semiconductor 135a and the second semiconductor 135b are polysilicon into which conductive impurities have been doped, that is, impurity semiconductors.

The impurities doped into the source regions 1356a and 1356b, the drain regions 1357a and 1357b, and the first capacitor electrode 138 can be either p-type impurities and n-type impurities.

A gate insulating layer 140 is formed on the first semiconductor 135a, the second semiconductor 135b, and the first capacitor electrode 138. The gate insulating layer 140 can be a single layer or a plurality of layers including at least one of tetraethyl orthosilicate (TEOS), silicon nitride ($SiN_x$), and silicon oxide ($SiO_2$).

The gate line 121, a second gate electrode 155b, and a second capacitor electrode 158 are formed on the gate insulating layer 140.

The gate line 121 lengthily extends in a horizontal direction and transfers a gate signal, and includes a first gate electrode 155a that is protruded from the gate line 121 to the first semiconductor 135a.

The first gate electrode 155a and the second gate electrode 155b overlap with the respective channel regions 1355a and 1355b, and the second capacitor electrode 158 overlaps with the first capacitor electrode 138.

Each of the second capacitor electrode 158, the first gate electrode 155a, and the second gate electrode 155b can have a single layer of a plurality of layers made of molybdenum, tungsten, copper, aluminum, or an alloy thereof.

The first capacitor electrode 138 and the second capacitor electrode 158 form a capacitor Cst using the gate insulating layer 140 as a dielectric material.

A first interlayer insulating layer 160 is formed on the first gate electrode 155a, the second gate electrode 155b, and the second capacitor electrode 158. The first interlayer insulating layer 160, like the gate insulating layer 140, can be made of tetraethyl orthosilicate (TEOS), silicon nitride ($SiN_x$), or silicon oxide ($SiO_2$).

The first interlayer insulating layer 160 and the gate insulating layer 140 include a source contact hole 166 and a drain contact hole 167 through which the source regions 1356a and 1356b and the drain regions 1357a and 1357b are exposed, respectively.

The data lines 171 including a first source electrode 176a, the driving voltage lines 172 including a second source electrode 176b, a first drain electrode 177a, and a second drain electrode 177b are formed on the first interlayer insulating layer 160.

The data line 171 transmits a data signal and extends in a direction crossing the gate line 121.

The driving voltage line 172 transmits a predetermined voltage, and extends in the same direction as that of the data line 171 while being separated from the data line 171.

The first source electrode 176a protrudes toward the first semiconductor 135a from the data line 171, and the second source electrode 176b protrudes toward the second semiconductor 135b from the driving voltage line 172. The first source electrode 176a and the second source electrode 176b are connected with the source regions 1356a and 1356b through the source contact holes 166, respectively.

The first drain electrode 177a faces the first source electrode 176a and is connected with the drain region 1357a through the drain contact hole 167.

The first drain electrode 177a extends along the gate line, and is electrically connected with the second gate electrode 155b through a contact hole 81.

The second drain electrode 177b is connected with the drain region 1357b through the drain contact hole 167.

The data line 171, the driving voltage line 172, and the first drain electrode 177a may be formed as a single layer or a multilayer formed of a low resistance material, such as Al, Ti, Mo, Cu, Ni, or an alloy thereof, or a corrosion resistant material. For example, the data line 171, the driving voltage line 172, and the first drain electrode 177a may be triple layers of Ti/Cu/Ti or Ti/Ag/Ti.

In one embodiment, the capacitor Cst is formed by overlapping the first capacitor electrode 138 and the second capacitor electrode 158, but the capacitor Cst having a metal/dielectric/metal structure may be formed by forming an electrode on the same layer as that of the data line 171 or the same layer as that of a first electrode 710.

A second interlayer insulating layer 180 is formed on the data line 171, the driving voltage line 172, the first drain electrode 177a, and the second drain electrode 177b.

A light path control layer 300 is formed on the second interlayer insulating layer 180. The light path control layer 300 includes a pair of a first control layers 32, 32' and a pair of second control layers 34, 34', and a middle layer 40R, 40G, and 40B.

The first control layers 32, 32' and the middle layer 40R, 40G, and 40B are made of a low refractive index material, and the second control layers 34, 34' are made of a high refractive index material. The low refractive index material may be $SiO_2$ or $MgF_3$, and the high refractive index material may be $TiO_2$, ZnS, $CeO_2$, $Al_2O_3$, SiNx, or $ZrO_2$.

The first control layer 32 and the second control layer 34, and the first control layer 32' and the second control layer 34' are each formed as a pair at respective sides of the middle layer 40R, 40G, and 40B, and are positioned to be symmetrical to each other.

That is, the first control layer 32, the second control layer 34, the middle layer 40R, 40G, and 40B, the second control layer 34', and the first control layer 32' may be sequentially deposited, or the second control layer 34, the first control layer 32, the middle layer 40R, 40G, and 40B, the first control layer 32', and the second control layer 34' may be sequentially deposited.

Also, when including four pairs of the first control layer and the second control layer, the first control layer 32, the second control layer 34, the first control layer 32', the second control layer 34', the middle layer 40R, 40G, and 40B, the second control layer 34'', the first control layer 32'', the second control layer 34''', and the first control layer 32'''' may be sequentially deposited, or the second control layer 34, the first control layer 32, the second control layer 34', the first control layer 32', the middle layer 40R, 40G, and 40B, the first control layer 32'', the second control layer 34'', the first control layer 32''', and the second control layer 34''' may be sequentially deposited.

The thickness of the first control layer 32 and the second control layer 34 may be formed to have a process margin of ±5%, and the thickness of the deposited light path control layer is preferably less than 1 μm.

Also, the first electrode 710 is formed on the light path control layer 300. The first electrode 710 may be an anode electrode of the organic light emitting device of FIG. 1. The first electrode 710 is connected with the second drain electrode 177b through a contact hole 82.

In one embodiment, the second drain electrode 177b and the first electrode 710 are connected through the contact hole 82 with the second interlayer insulating layer 180 interposed therebetween, but the second drain electrode 177b and the first electrode 710 may be integrally formed.

A pixel defining layer 190 is formed on the first electrode 710.

The pixel defining layer 190 includes an opening 195 through which the first electrode 710 is exposed. The pixel defining layer 190 may be formed of a polyacrylate-based or polyimide-based resin and a silica-based inorganic material.

An organic emission layer 720 is formed on the opening 195 of the pixel defining layer 190.

The organic emission layer 720 may be formed of a low molecular organic material or a high molecular organic material, such as poly(3,4-ethylenedioxythiophene) (PEDOT). Further, the organic emission layer 720 may be formed as a multilayer including at least one of a light emission layer, a hole injection layer HIL, a hole transporting layer HTL, an electron transporting layer ETL, and an electron injection layer EIL. When the organic emission layer 720 includes all of the light emission layer, the hole injection layer HIL, the hole transporting layer HTL, the electron transporting layer ETL, and the electron injection layer EIL, the hole injection layer is disposed on the first electrode 710 that is an anode, and the hole transporting layer HTL, the light emission layer, the electron transporting layer ETL, and the electron injection layer EIL are sequentially stacked on the hole injection layer.

The organic emission layer 720 may implement a white color by stacking the red organic emission layer, and the green organic emission layer, and the blue organic emission layer in the red pixel, the green pixel, and the blue pixel, together. Alternatively, a white organic emission layer for emitting white light may be formed in all of the red pixel, the green pixel, and the blue pixel.

The white organic emission layer may also include a configuration capable of emitting white light by combining at least one yellow organic emission layer and at least one blue organic emission layer. The white organic emission layer may also include a configuration capable of emitting white light by combining at least one cyan organic emission layer and at least one red organic emission layer. The white organic emission layer may also include a configuration capable of emitting white light by combining at least one magenta organic emission layer and at least one green organic emission layer.

A second electrode 730 is formed on the pixel defining layer 190 and the organic emission layer 720.

The second electrode 730 is a cathode electrode of the organic light emitting diode. Accordingly, the second electrode 710, the organic emission layer 720, and the common electrode 730 form the organic light emitting diode 70.

The organic light emitting diode display may have any one structure among a top display type, a bottom display type, and a dual display type according to a direction of emitting light by the organic light emitting diode 70.

In a bottom display type, the first electrode 710 is formed as a transparent layer or a semi-transmitting layer, and the second electrode 730 is formed as a reflective layer. The reflective layer and the semi-transmitting layer are formed of at least one metal among magnesium (Mg), silver (Ag), gold (Au), calcium (Ca), lithium (Li), chromium (Cr), and aluminum (Al), or an alloy thereof. The reflective layer and the semi-transmitting layer are determined by thickness, and the semi-transmitting layer may be formed to have a thickness equal to or less than about 200 nm. As the thickness is decreased, transmittance of light is increased, but when the thickness is excessively small, resistance is increased.

The transparent layer may be formed of a material such as indium tin oxide (ITO), indium zinc oxide (IZO), zinc oxide (ZnO), or indium oxide ($In_2O_3$).

In one embodiment, by forming the light path control layer 300, red, green, and blue light may be extracted without a color filter.

This will be described in detail with reference to FIG. 4 to FIG. 13.

Figure 4:
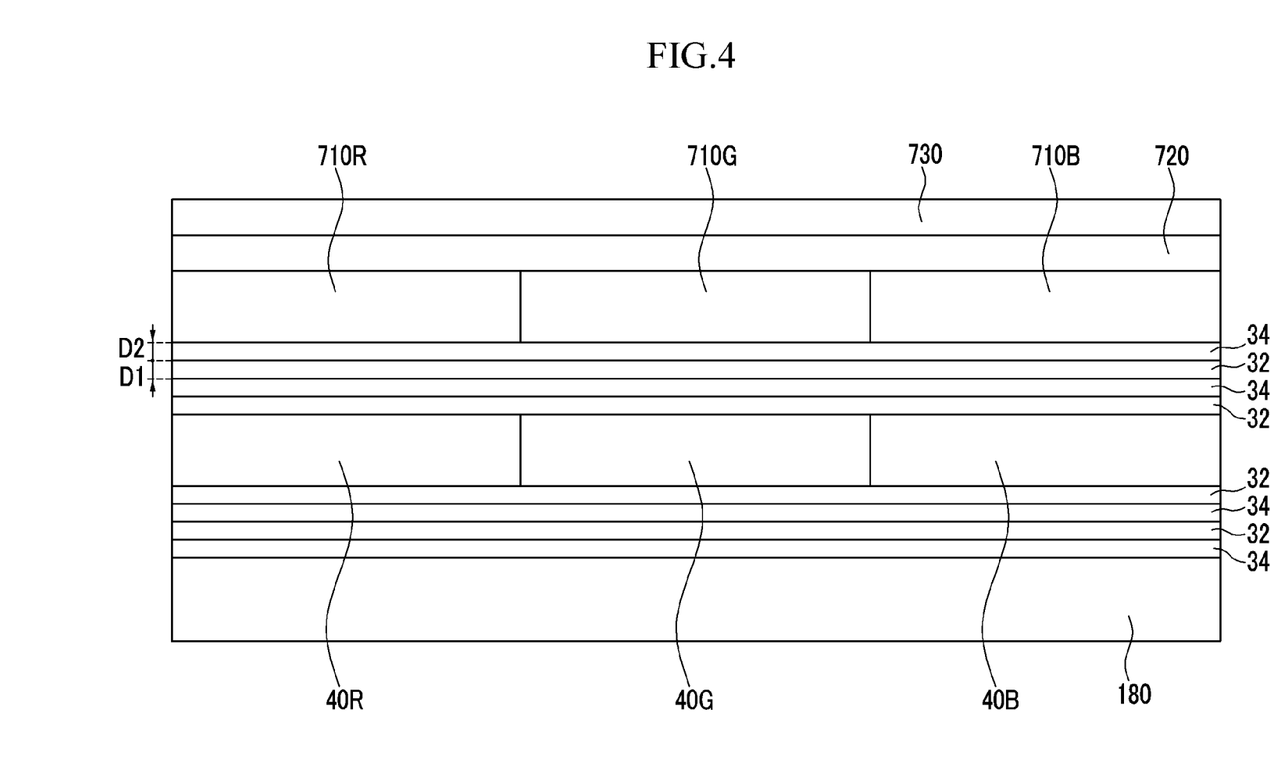
FIG. 4 is a cross-sectional view of red, green, and blue pixels of an organic light emitting diode (OLED) display according to an embodiment.

FIG. 4 is a cross-sectional view of red, green, and blue pixels of an organic light emitting diode (OLED) display according to an embodiment, and FIG. 5 to FIG. 13 are graphs of transmittance and reflectivity for a wavelength according to an embodiment.

Referring to FIG. 4, the organic light emitting diode (OLED) display includes red, green, and blue pixels, each pixel includes the light path control layer 300 formed with the first control layer 32, the second control layer 34, and middle layers 40R, 40G, and 40B formed on the second interlayer insulating layer 180, and first electrodes 710R, 710G, and 710B formed on the light path control layer 300, the organic emission layer 720, and the second electrode 730.

As shown in FIG. 4, to realize the red, green, and blue pixels by forming the light path control layer, the thickness of the first control layer 32 and the second control layer 34 must be controlled such that light may be extinguished and undergo interference in a transmission mode.

The thickness of the first control layer 32 and the second control layer 34 may be obtained according to Equation 1 below.

The light incident to the light path control layer 300 is emitted at an angle θ and θ=0 when an offset interference is generated, and a minimum thickness of the first control layer 32 and the second control layer 34 may be obtained by Equation 1.

$$2 \times d \times n = (m + \tfrac{1}{2})\lambda$$

$$d = \lambda/(4 \times n) \quad \text{[Equation 1]}$$

where d=a thickness of a control layer, n=a refractive index of a control layer, m=a natural number of 0, 1, 2 . . . .

For example, when the first control layer 32 is formed of $SiO_2$, the second control layer 34 is formed of TiO2, and n1 and n2 are respectively 1.46 and 2.51, d1 is 54.9 nm and d2 is 94.2 nm according to Equation 1.

Figure 5:
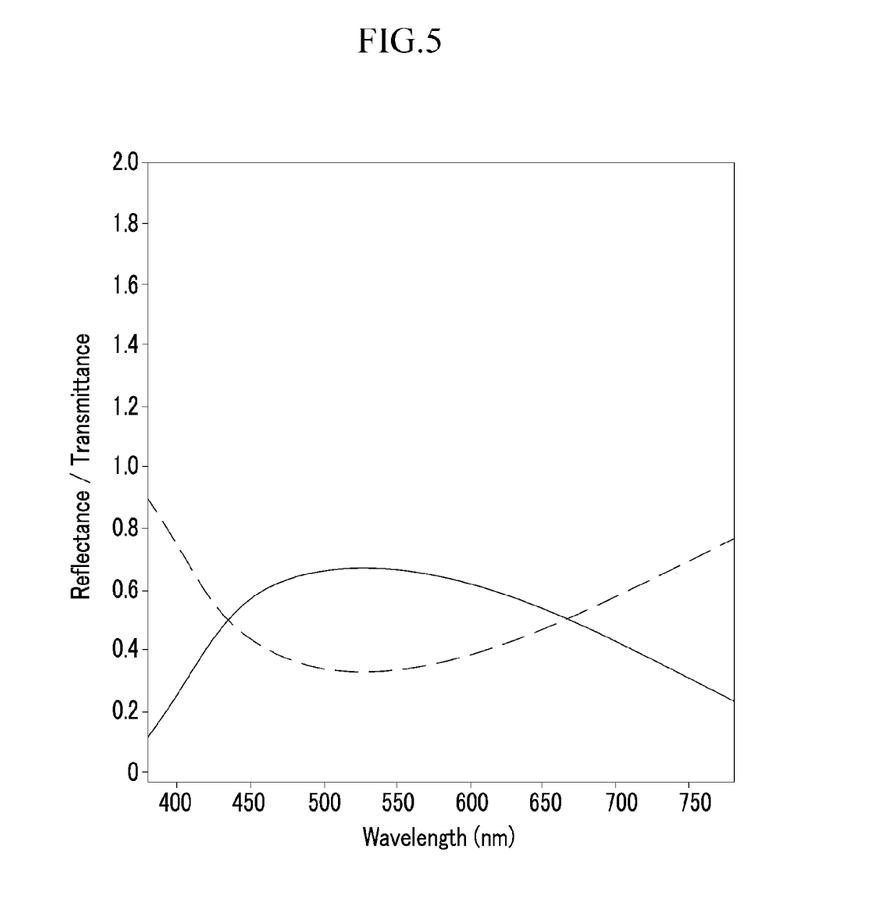
FIG. 5 to FIG. 13 are graphs of transmittance and reflectivity for a wavelength according to an embodiment.
Figure 6:
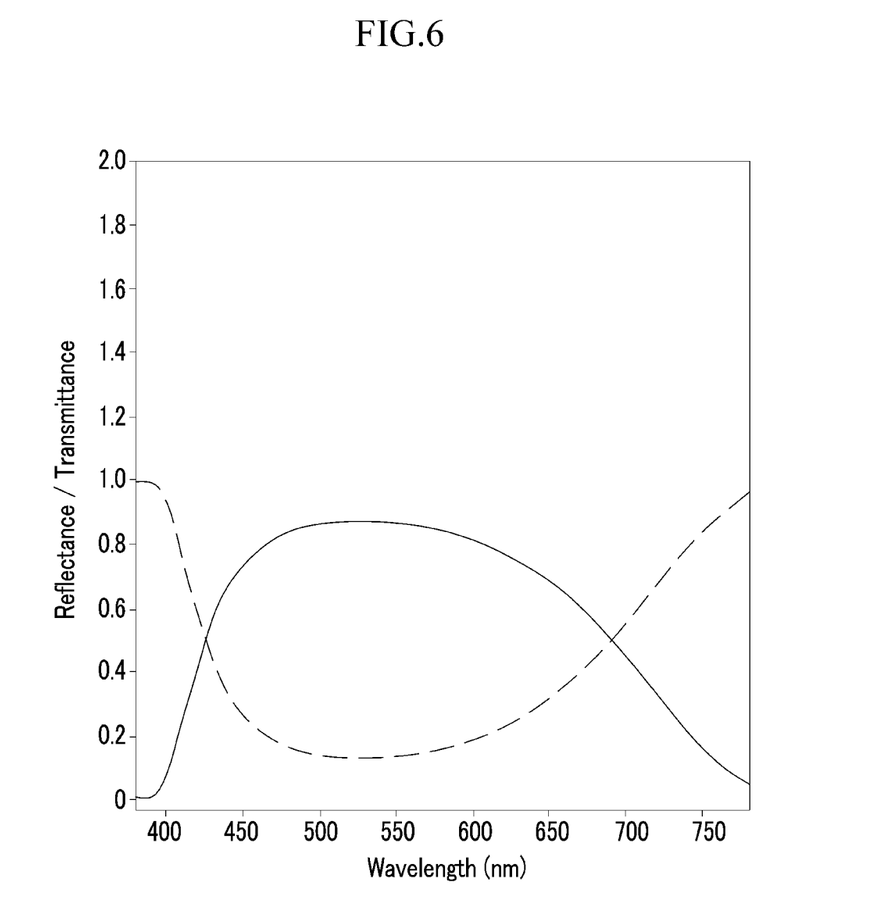
Figure 7:
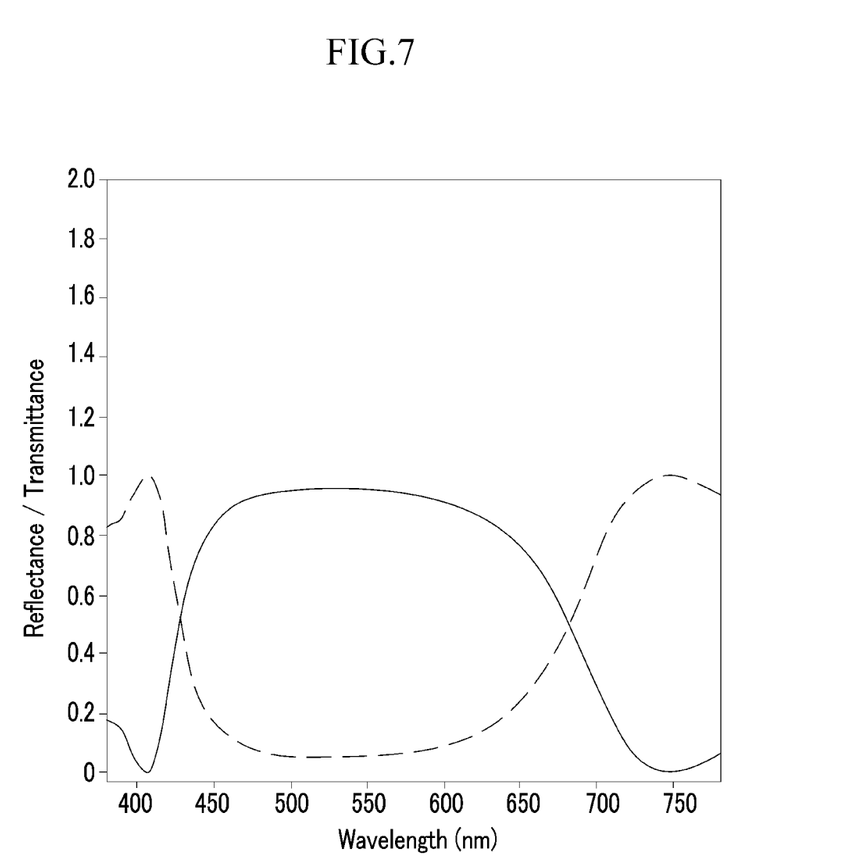

If the obtained d1 and d2 are respectively simplified to 52 nm and 91 nm, various pairs such as 2 pairs, 3 pairs, or 4 pairs are deposited, and a simulation is performed in the transmission mode, as shown in FIG. 5 to FIG. 7, when depositing four pairs of the first control layer 32 and the second control layer 34, a broadband characteristic appears.

If the first control layer 32 and the second control layer 34 are deposited for offset-interference, only red, green, and blue wavelengths may be extracted by changing the thickness of the middle layer.

For example, when the first control layer 32 is SiO2 and the second control layer 34 is TiO2, if d1 and d2 are respectively 52 nm and 91 nm, four pairs of the first control layer 32 and the second control layer 34 are deposited for extinction-interference.

Figure 8:
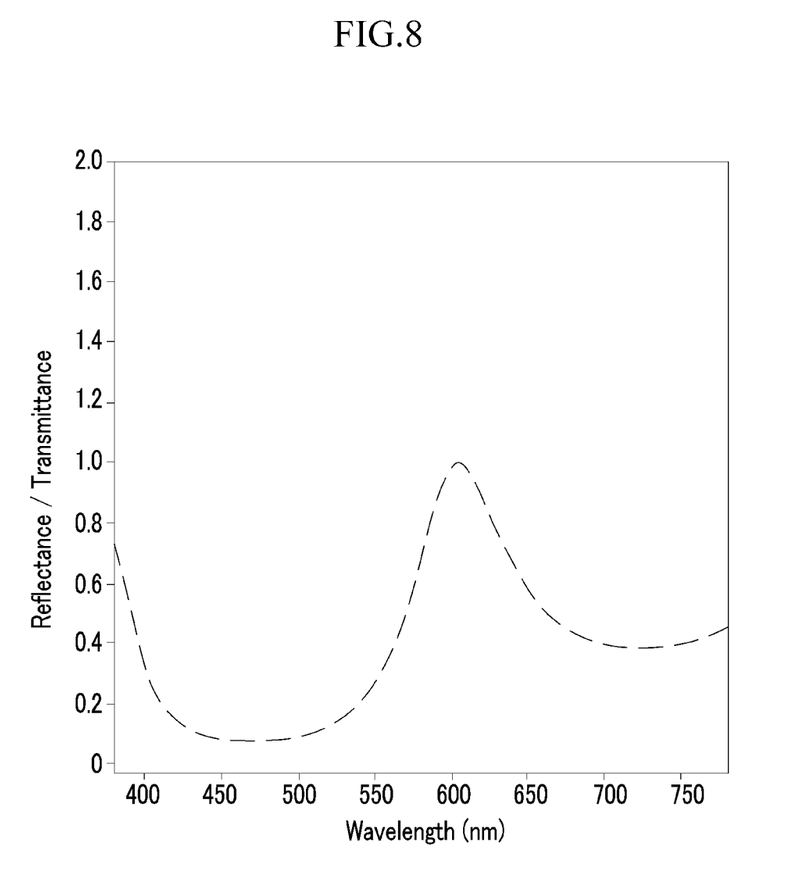
Figure 9:
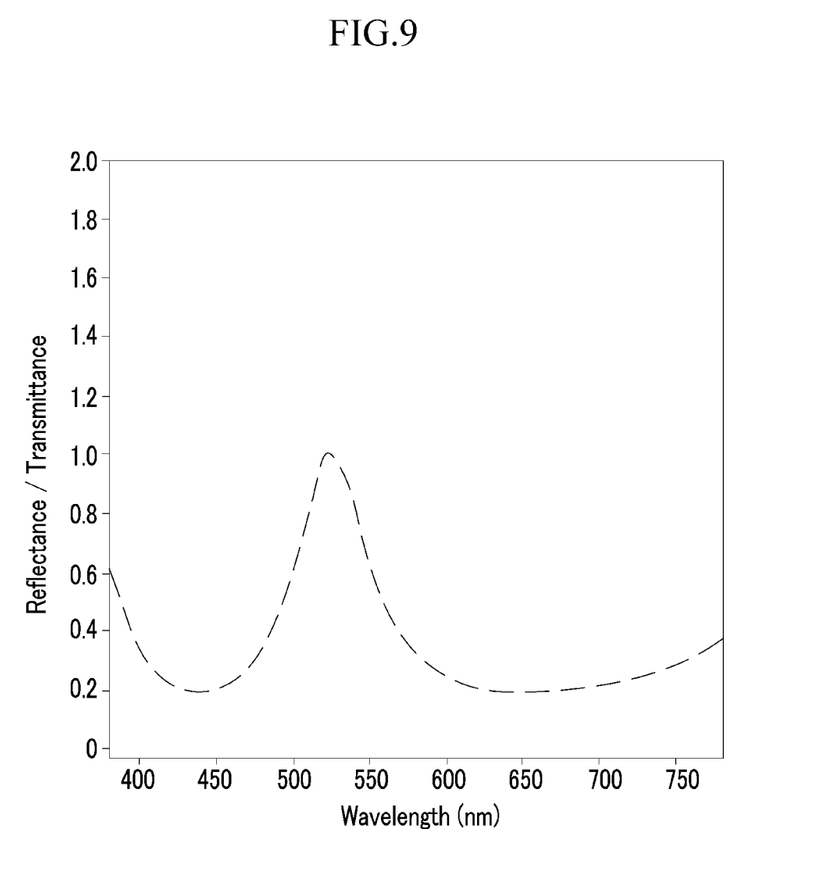
Figure 10:
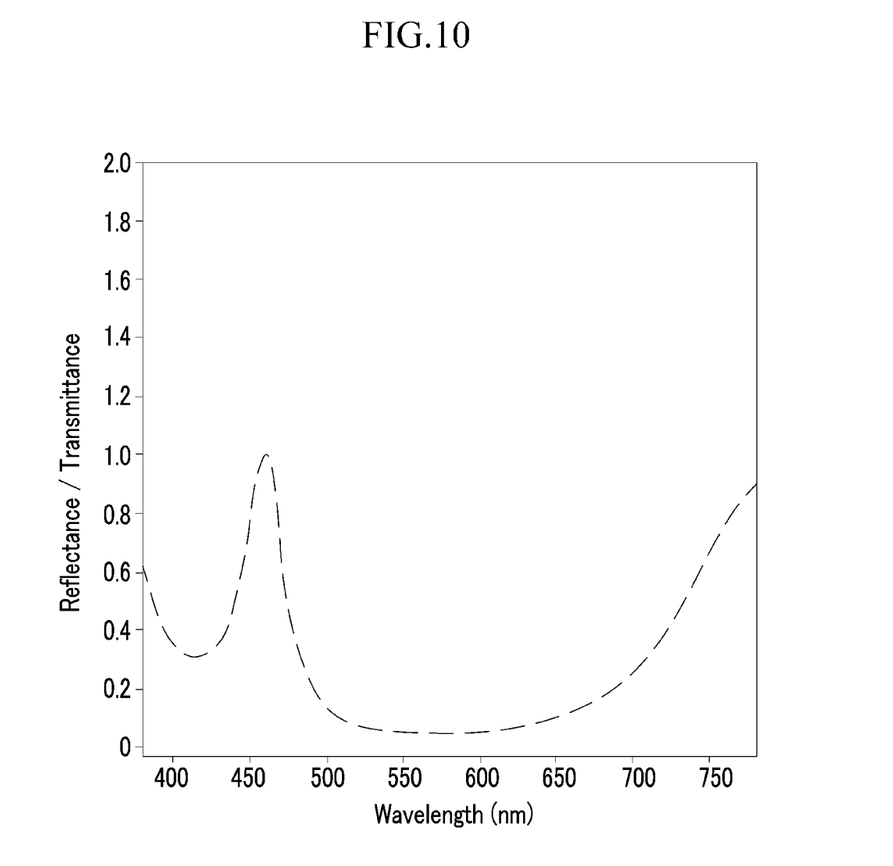

If the middle layer 40R, 40G, and 40B is respectively formed to be 30 nm, 0 nm, and 133 nm, as shown in FIG. 8 to FIG. 10, the wavelengths of red, green, and blue may be extracted.

Figure 11:
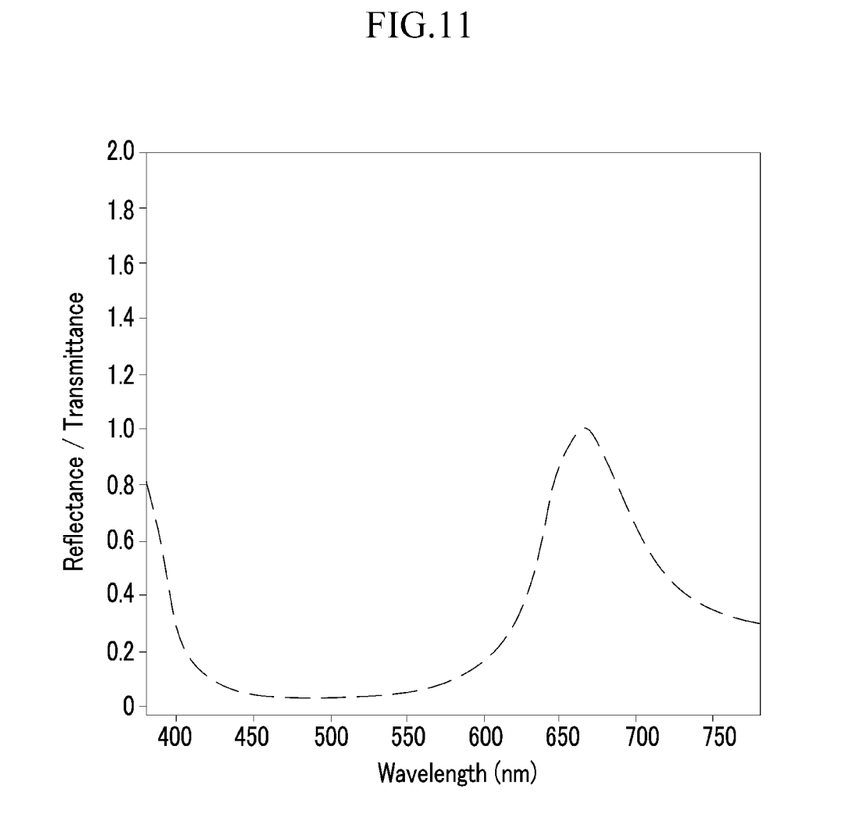
Figure 12:
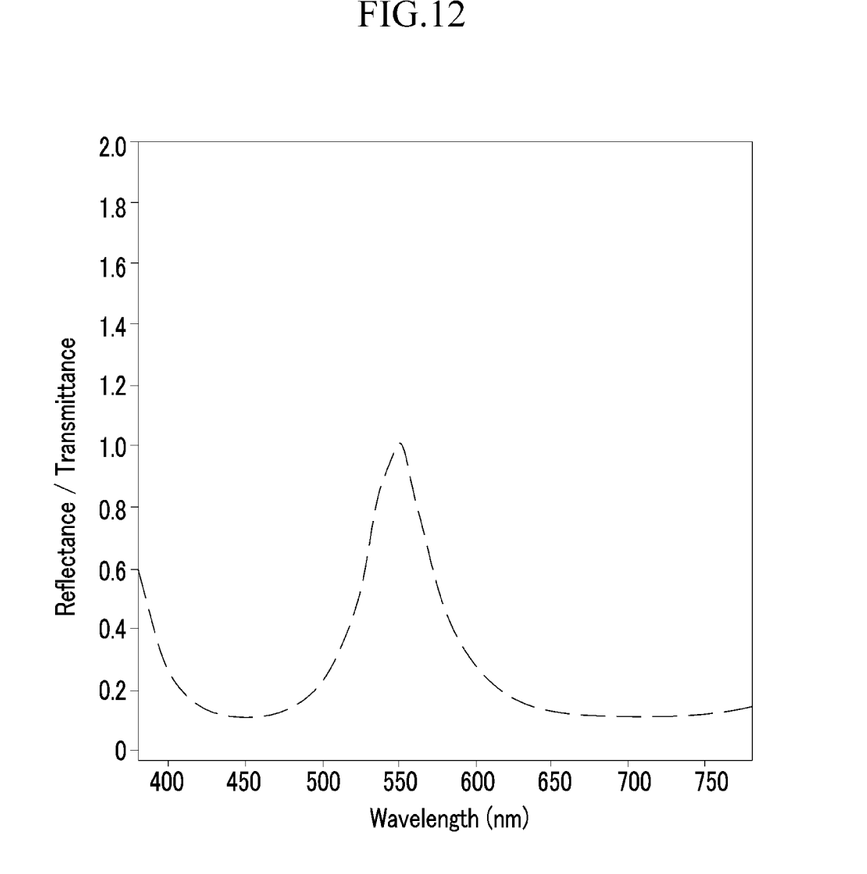
Figure 13:
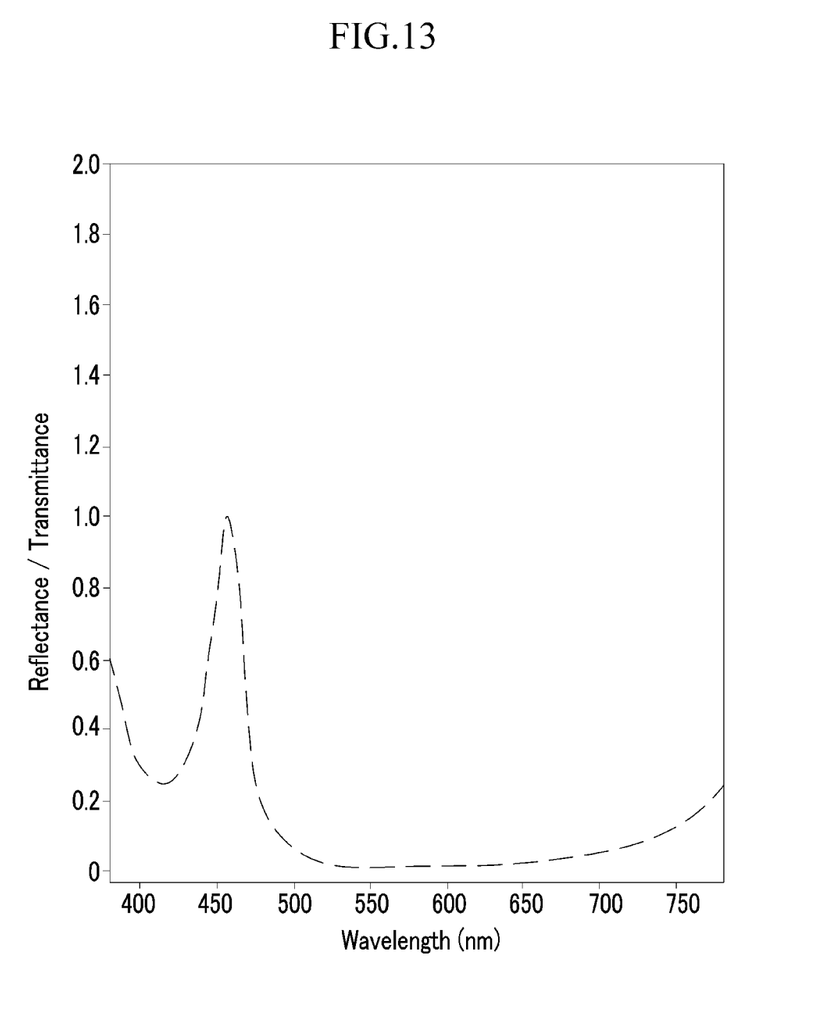

As another example, if the refractive index of the first control layer 32 is 1.7 and the refractive index of the second control layer 34 is 3.4, d1 is 80.8 nm and d2 is 40.4 nm, and if the middle layer 40R, 40G, and 40B is formed with the thickness of 30 nm, 0 nm, and 110 nm, as shown in FIG. 11, FIG. 12, and FIG. 13, the light of red, green, and blue may be extracted. At this time, two pairs of the first control layer 32 and the second control layer 34 are positioned at respective sides of the middle layer.

In the above embodiment, in the green pixel, as the thickness of the middle layer is 0 nm, the middle layer was not formed, however for convenience of description, it was described that the middle layer has a thickness of 0 nm.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

| <Description of Symbols> | |
|---|---|
| 32: first control layer | 34: second control layer |
| 40R, 40G, and 40B: middle layer | 70: organic light emitting element |
| 100: substrate | 81, 82, 166, 167: contact hole |
| 120: buffer layer | 121: gate line |
| 135a: first semiconductor | 135b: second semiconductor |
| 138: first capacitor electrode | 140: gate insulating layer |
| 155a, 155b: gate electrode | 158: second capacitor electrode |
| 160: interlayer insulating layer | 171: data line |
| 172: driving voltage line | 300: light path control layer |
| 176a, 176b: source electrode | 177a, 177b: drain electrode |
| 180: second interlayer insulating layer | 190: pixel definition layer |
| 710: first electrode | 720: organic emission layer |
| 730: second electrode | 1355a, 1355b: channel region |
| 1356a, 1356b: source region | 1357a, 2357b: drain region |

What is claimed is:

1. An organic light emitting diode (OLED) display comprising:
   a substrate; and
   a plurality of pixels positioned on the substrate, wherein the plurality of pixels includes a red pixel, a green pixel and a blue pixel,
   wherein each of the plurality of pixels includes:
      a thin film transistor positioned on the substrate,
      an interlayer insulating layer and a light path control layer positioned on the thin film transistor, a first electrode positioned on the light path control layer and connected to the thin film transistor, an organic emission layer positioned on the first electrode, and a second electrode positioned on the organic emission layer, wherein the light path control layer includes a first control layer, a second control layer having a larger refractive index than the first control layer, and a middle layer having the same refractive index as the first control layer, wherein thicknesses of the middle layer respectively positioned at the red, the green, and the blue pixels are different from one another.

2. The organic light emitting diode (OLED) display of claim 1, wherein the first control layer and the second control layer are positioned as a pair at both sides of the middle layer.

3. The organic light emitting diode (OLED) display of claim 2, wherein a plurality of pairs of the first control layer and the second control layer are positioned around the middle layer, and the first control layer and the second control layer are alternatively disposed.

4. The organic light emitting diode (OLED) display of claim 3, wherein the first control layer and the second control layer are symmetrical with respect to the middle layer.

5. The organic light emitting diode (OLED) display of claim 1, wherein the first control layer includes at least one of $SiO_2$ or $MgF_3$.

6. The organic light emitting diode (OLED) display of claim 1, wherein the second control layer includes at least one of $TiO_2$, ZnS, $CeO_2$, $Al_2O_3$, $SiN_x$, or $ZrO_2$.

7. The organic light emitting diode (OLED) display of claim 1, wherein a difference between the refractive indexes of the first control layer and the second control layer is in a range of about 1.0 to 2.0.

8. The organic light emitting diode (OLED) display of claim 1, wherein the organic emission layer emits white light.

9. The organic light emitting diode (OLED) display of claim 1, wherein the organic emission layer includes a red emission layer, a green emission layer, and a blue emission layer.

10. The organic light emitting diode (OLED) display of claim 1, wherein the thickness of the middle layer of the blue pixel is larger than the thickness of the middle layer of the red pixel and wherein the thickness of the middle layer of the red pixel is larger than the thickness of the middle layer of the green pixel.

11. The organic light emitting diode (OLED) display of claim 10, wherein the thicknesses of each of the respective middle layers of the green pixel, the red pixel, and the blue pixel are in a range from about 3% to 5% of the thickness of the light path control layer.

12. The organic light emitting diode (OLED) display of claim 11, wherein the thickness of the light path control layer is less than about 1 µm.

* * * * *